(12) United States Patent
Hayashi et al.

(10) Patent No.: US 11,404,617 B2
(45) Date of Patent: Aug. 2, 2022

(54) METHOD FOR MANUFACTURING IMAGE DISPLAY DEVICE

(71) Applicant: DEXERIALS CORPORATION, Tokyo (JP)

(72) Inventors: Naoki Hayashi, Utsunomiya (JP); Yoshihisa Shinya, Utsunomiya (JP); Kouichi Ogawa, Utsunomiya (JP); Tsukasa Nakamura, Utsunomiya (JP)

(73) Assignee: DEXERIALS CORPORATION, Tochigi (JP)

( * ) Notice: Subject to any disclaimer, the term of this patent is extended or adjusted under 35 U.S.C. 154(b) by 152 days.

(21) Appl. No.: 16/122,488

(22) Filed: Sep. 5, 2018

(65) Prior Publication Data

US 2019/0006567 A1   Jan. 3, 2019

Related U.S. Application Data

(63) Continuation of application No. 13/985,379, filed as application No. PCT/JP2013/061499 on Apr. 18, 2013, now abandoned.

(30) Foreign Application Priority Data

May 9, 2012   (JP) .................................. 2012-108013
Feb. 4, 2013   (JP) .................................. 2013-019434

(51) Int. Cl.
  *H01L 33/58*   (2010.01)
  *H01L 51/52*   (2006.01)
  (Continued)

(52) U.S. Cl.
  CPC ............ *H01L 33/58* (2013.01); *G02F 1/1333* (2013.01); *H01L 33/56* (2013.01);
  (Continued)

(58) Field of Classification Search
  CPC ....... G02F 1/1333; H01L 33/58; H01L 33/56; H01L 51/5246; H01L 51/5284; H05B 33/10
  (Continued)

(56) References Cited

U.S. PATENT DOCUMENTS

2004/0089397 A1   5/2004   Cheng et al.
2009/0162645 A1   6/2009   Matsuhira
(Continued)

FOREIGN PATENT DOCUMENTS

CN   101681575 A   3/2010
CN   101816026 A   8/2010
(Continued)

OTHER PUBLICATIONS

TW 201026801 English machine translation (Year: 2010).*
(Continued)

*Primary Examiner* — Michael N Orlando
*Assistant Examiner* — Elizabeth Bradford
(74) *Attorney, Agent, or Firm* — Oliff PLC

(57) ABSTRACT

A liquid photocurable resin composition not containing a thermal polymerization initiator is applied to a surface of a light-transmitting cover member having a light-shielding layer or a surface of an image display member, irradiated with ultraviolet rays under an atmosphere where the oxygen concentration is significantly decreased and cured, to form a light-transmitting cured resin layer. Subsequently, the image display member and the light-transmitting cover member are stacked through the light-transmitting cured resin layer to manufacture an image display device of the present invention.

5 Claims, 3 Drawing Sheets

(51) Int. Cl.
  *G02F 1/1333*  (2006.01)
  *H05B 33/10*  (2006.01)
  *H01L 33/56*  (2010.01)

(52) U.S. Cl.
  CPC ...... *H01L 51/5246* (2013.01); *H01L 51/5284* (2013.01); *H05B 33/10* (2013.01); *G02F 1/133331* (2021.01); *G02F 2202/28* (2013.01)

(58) Field of Classification Search
  USPC .................................................. 156/272.2
  See application file for complete search history.

(56) References Cited

U.S. PATENT DOCUMENTS

| | | |
|---|---|---|
| 2010/0003425 A1 | 1/2010 | Kamata et al. |
| 2010/0043965 A1 | 2/2010 | Kamiya et al. |
| 2010/0277684 A1 | 11/2010 | Fukushima et al. |
| 2013/0029075 A1 | 1/2013 | Niiyama et al. |
| 2014/0305582 A1 | 10/2014 | Ogawa et al. |
| 2015/0224756 A1* | 8/2015 | Kobayashi ........ B32B 17/10018 522/64 |

FOREIGN PATENT DOCUMENTS

| | | |
|---|---|---|
| JP | 2008/241728 A | 10/2008 |
| JP | 2008-281997 A | 11/2008 |
| JP | 2009-75576 A | 4/2009 |
| JP | 2009-86656 A | 4/2009 |
| JP | 2009-186954 A | 8/2009 |
| JP | 2010-7044 A | 1/2010 |
| JP | 2012-071281 A | 4/2012 |
| TW | 201026801 * | 7/2010 |
| WO | 2007/066590 A1 | 6/2007 |
| WO | 2008/126860 A1 | 10/2008 |
| WO | 2009/054168 A1 | 4/2009 |
| WO | 2010/027041 A1 | 3/2010 |
| WO | 2011/084405 A1 | 7/2011 |
| WO | 2011/148990 A1 | 12/2011 |

OTHER PUBLICATIONS

TW 201026801 partial English human translation of paragraph 21 (Year: 2010).*
May 29, 2019 Office Action Issued in Chinese Patent Application No. 201610002535.1.
Dec. 12, 2018 Office Action Issued in Chinese Patent Application No. 201610002535.1.
Nov. 21, 2014 Office Action issued in Chinese Patent Application No. 201380000984.7.
Mar. 19, 2015 Extended Search Report issued in European Patent Application No. 13787825.2.
Apr. 3, 2015 Office Action issued in Chinese Patent Application No. 201380000984.7.
Mar. 14, 2016 Office Action issued in Taiwanese Patent Application No. 102115566.
May 12, 2016 Extended Search Report issued in European Patent Application No. 16000689.6.
May 2, 2018 Office Action issued in Chinese Patent Application No. 201610002535.1.
Jun. 4, 2013 Search Report issued in International Patent Application No. PCT/JP2013/061499.
May 27, 2014 Office Action issued in Japanese Patent Application No. 2013-129621.
Apr. 23, 2021 Office Action issued in Chinese Patent Application No. 201610002535.1.
Sep. 7, 2020 Office Action issued in Chinese Patent Application No. 201610002535.1.

* cited by examiner

[FIG. 1A]
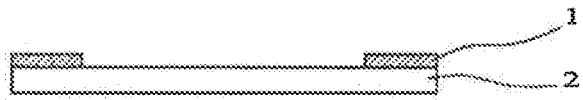
[FIG. 1B]
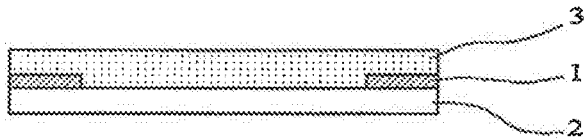
[FIG. 1C]
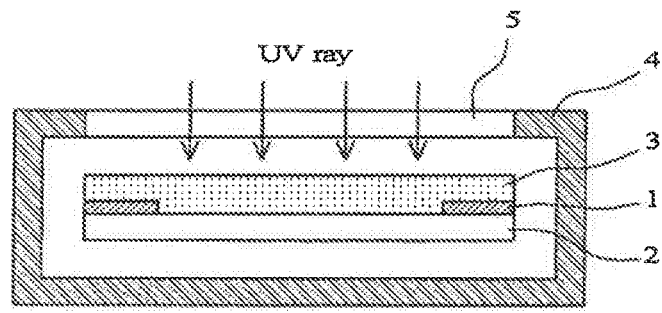
[FIG. 1D]
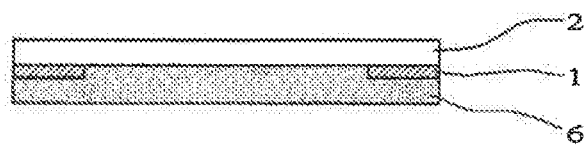
[FIG. 1E]
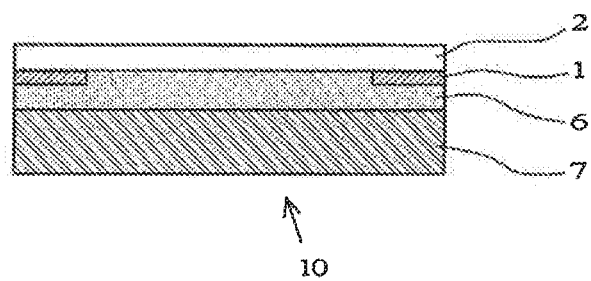

[FIG. 2A]
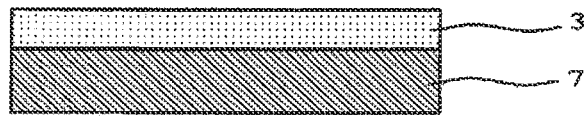
[FIG. 2B]
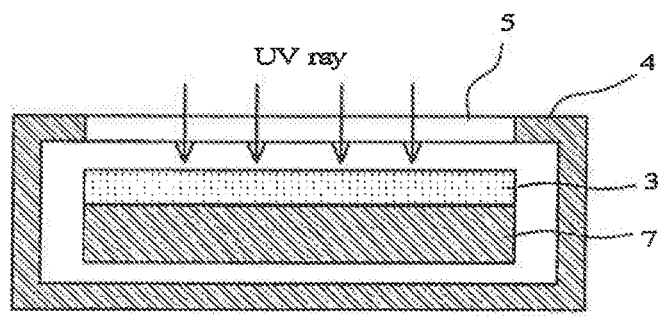
[FIG. 2C]
[FIG. 2D]
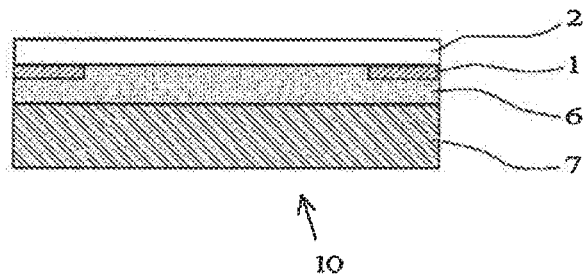

[FIG. 3]
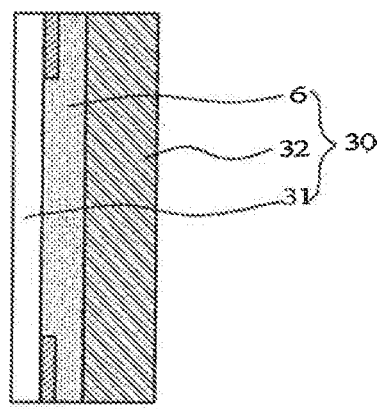
[FIG. 4]
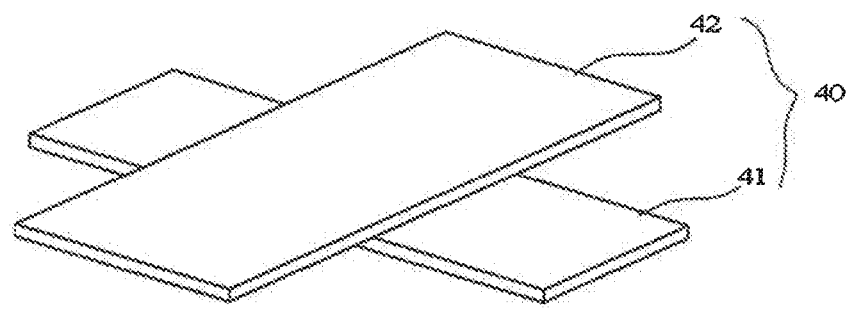

METHOD FOR MANUFACTURING IMAGE DISPLAY DEVICE

This is a Continuation of U.S. application Ser. No. 13/985,379 filed Aug. 14, 2013, which in turn is a National Stage Application of PCT/JP2013/061499 filed Apr. 18, 2013, which claims the benefit of Japanese Application No. 2013-019434 (filed Feb. 2, 2013) and Japanese Application No. 2012-108013 (filed May 9, 2012). The disclosures of the prior applications are hereby incorporated by reference herein in their entireties.

TECHNICAL FIELD

The present invention relates to a method for manufacturing an image display device including bonding and stacking an image display member such as a liquid crystal display panel and a light-transmitting cover member such as a transparent protective sheet disposed on the surface side of the image display member, through a light-transmitting cured resin layer.

BACKGROUND ART

An image display device such as a liquid crystal display panel used in a data terminal such as a smartphone has been manufactured by placing a photocurable resin composition between an image display member, such as a liquid crystal display panel and an organic EL display panel, and a light-transmitting cover member, irradiating the composition with ultraviolet rays, and curing the composition to form a light-transmitting cured resin layer, thereby bonding and stacking the image display member and the light-transmitting cover member (Patent Literature 1).

A light-shielding layer is provided in a peripheral portion of a surface on the image display member side of the light-transmitting cover member to enhance the luminance and contrast of a display image. For this reason, curing of the photocurable resin composition interposed between such a light-shielding layer and the image display member does not sufficiently proceed. Therefore, a sufficient adhesion force cannot be obtained. Accordingly, there have been concerns that positional error between the light-transmitting cover member and the image display member and peeling between them and the photocurable resin adhesion faces occur, and the uncured and remaining photocurable resin composition is impregnated into the light-shielding layer to change the color.

It has been proposed that a thermal polymerization initiator is mixed in a photocurable resin composition to form a thermosetting and photocurable resin composition, the thermosetting and photocurable resin composition is applied to a surface of a light-transmitting cover member having a light-shielding layer to stack the applied surface on an image display member, the composition is irradiated with ultraviolet rays and thus cured by light, and the entire product is heated to thermally cure the thermosetting and photocurable resin composition interposed between the light-shielding layer and the image display member (Patent literature 2).

CITATION LIST

Patent Literature

Patent literature 1: International Publication No. 2010/027041

Patent literature 2: International Publication No. 2008/126860

SUMMARY OF INVENTION

Technical Problem

The technique in Patent literature 2 is expected to solve the problems concerned in Patent Literature 1. However, a photopolymerization initiator is simultaneously used in combination with a thermal polymerization initiator, and a photopolymerization process and a thermal polymerization process need be applied to the whole image display device. Therefore, a facility for a photopolymerization process and a facility for a thermal polymerization process are required, and a manufacturing operation becomes complex. Thus, there have been problems of an increase in the manufacturing cost and a reduction in the storage stability of the thermosetting and photocurable resin composition. Further, it is desirable that a surface of a thermosetting and photocurable resin composition layer be cured by light prior to the thermal polymerization process in order to suppress the occurrence of polymerization inhibition by oxygen during the thermal polymerization process. Many image display devices have problems that the surface of the thermosetting and photocurable resin composition layer cannot be irradiated with ultraviolet rays in terms of the structure of the device and the thermosetting and photocurable resin composition layer cannot be thermally cured sufficiently during the thermal polymerization process.

In order to solve these problems, a procedure in which a photocurable resin composition not containing a thermal polymerization initiator is applied to a surface of a light-transmitting cover member or an image display member, and is irradiated with ultraviolet rays and cured, and then they are bonded has been attempted. However, even by the attempt of the procedure, a sufficient adhesion between the light-transmitting cover member and the image display member cannot be achieved. In particular, a problem of peeling between both the members under a reliability test environment (under high temperature and high humidity) cannot be solved.

It is an object of the present invention is to solve the problems in the conventional techniques, and to manufacture an image display device by stacking an image display member and a light-transmitting cover member disposed on the surface side of the image display member through a light-transmitting cured resin layer formed from a photocurable resin composition, wherein the light-transmitting cured resin layer between a light-shielding layer and the image display member is in such a cured state that adhesion strength can be maintained without use of a thermal polymerization process even under a heating environment.

Solution to Problem

The present inventors have found that when a liquid photocurable resin composition is irradiated with ultraviolet rays and a surface thereof is observed, uncured liquid regions are dotted. Accordingly, the present inventors have assumed that it is highly possible that such an uncured liquid region will exist on a bonding face of the light-transmitting cover member or the image display member.

On this assumption, in order to remove an influence of curing inhibition by oxygen on a liquid photocurable resin composition, for example, a film of the photocurable resin composition is irradiated with ultraviolet rays under vacuum or a nitrogen atmosphere, or a material in which an inhibitor for inhibiting curing, such as an amine compound and a phosphorus-based compound, is mixed is used as the photocurable resin composition. As a result, a light-transmitting cured resin layer is formed so that not only the cure rate of the entire layer of the photocurable resin composition but also the cure rate of the outermost surface thereof are 90% or more. The present inventors have found that when the image display member and the light-transmitting cover member are stacked through the thus obtained light-transmitting cured resin layer, the adhesion of the photocurable resin composition between the light-transmitting cover member and the image display member is not reduced even under a heating environment. The present invention has been completed.

Therefore, the present invention provides a method for manufacturing an image display device including the following steps (A) to (C), wherein an image display member and a light-transmitting cover member having a light-shielding layer formed in a peripheral portion are stacked through a light-transmitting cured resin layer formed from a liquid photocurable resin composition so that a light-shielding layer-forming face of the light-transmitting cover member is disposed on the image display member side.

<Step (A)>

A step of applying the liquid photocurable resin composition to the light-shielding layer-forming face of the light-transmitting cover member or the surface of the image display member to form a photocurable resin composition layer.

<Step (B)>

A step of irradiating the photocurable resin composition layer with ultraviolet rays so that the cure rate of the outermost surface is 90% or more and the cure rate of the entire layer is 90% or more, to form a light-transmitting cured resin layer.

Here, one of specific examples of the step (B) is as follows.

A step of irradiating the photocurable resin composition layer with ultraviolet rays under reduced pressure or an inert gas atmosphere so that the cure rate of the outermost surface is 90% or more, the cure rate of the entire layer is 90% or more, and the photocurable resin composition is not in contact with oxygen, to form a light-transmitting cured resin layer.

<Step (C)>

A step of bonding the light-transmitting cover member to the image display member so that the light-transmitting cured resin layer is placed inside.

Advantageous Effects of Invention

In the method for manufacturing an image display device of the present invention, the ultraviolet rays is irradiated so that the cure rate of the outermost surface of the light-transmitting cured resin layer between the light-shielding layer and the image display member and the cure rate of the entire layer are 90% or more. For this reason, the adhesion strength of the light-transmitting cured resin layer can be maintained even under a heating environment without use of a thermal polymerization process.

BRIEF DESCRIPTION OF DRAWINGS

FIG. 1A is a view illustrating a step (A) in a method for manufacturing an image display device of the present invention.

FIG. 1B is a view illustrating the step (A) in the method for manufacturing an image display device of the present invention.

FIG. 1C is a view illustrating a step (B) in the method for manufacturing an image display device of the present invention.

FIG. 1D is a view illustrating the step (B) in the method for manufacturing an image display device of the present invention.

FIG. 1E is a view illustrating a step (C) in the method for manufacturing an image display device of the present invention.

FIG. 2A is a view illustrating a step (AA) in the method for manufacturing an image display device of the present invention.

FIG. 2B is a view illustrating a step (BB) in the method for manufacturing an image display device of the present invention.

FIG. 2C is a view illustrating the step (BB) in the method for manufacturing an image display device of the present invention.

FIG. 2D is a view illustrating a step (CC) in the method for manufacturing an image display device of the present invention.

FIG. 3 is a view illustrating a creep test of a light-transmitting cured resin layer.

FIG. 4 is a view illustrating an evaluation test of an adhesion state of a light-transmitting cured resin layer.

DESCRIPTION OF EMBODIMENTS

Hereinafter, each step in the method for manufacturing an image display device of the present invention including steps (A) to (C) will be described in detail with reference to the drawings.

<Step (A) (Applying step)>

As shown in FIG. 1A, a light-transmitting cover member 2 having a light-shielding layer 1 formed in a peripheral portion of a single side is prepared. As shown in FIG. 1B, a liquid photocurable resin composition 3 is applied to a surface of the light-transmitting cover member 2.

The application of the photocurable resin composition 3 may be performed a plurality of times until a necessary thickness is achieved.

The light-transmitting cover member 2 is required to be light transmissive so that an image formed on the image display member can be visually recognized, and examples thereof may include a plate-shaped material and a sheet-shaped material, that are made of glass, an acrylic resin, polyethylene terephthalate, polyethylene naphthalate, polycarbonate, and the like. These materials may be subjected to a single-side or double-side hard coating treatment, an antireflection treatment, or the like. The physical properties such as thickness and elasticity of the light-transmitting cover member 2 can be appropriately determined depending on the purposes of use.

The light-shielding layer 1 is provided to increase the contrast of an image. Further, the light-shielding layer 1 is obtained by applying a paint colored black or the like through a screen printing method, followed by drying and curing. The thickness of the light-shielding layer 1 is generally 5 to 100 μm.

The nature of the photocurable resin composition 3 used in this step is liquid. By use of the liquid photocurable resin composition, a step between the light-shielding layer 1 and a surface on the light-shielding layer-forming side of the light-transmitting cover member 2 can be canceled. The term "liquid" used herein means those showing a viscosity of 0.01 to 100 Pa·s (cone-plate rheometer, 25° C., cone and plate: C35/2, rotation speed: 10 rpm).

Examples of such a photocurable resin composition 3 may include a composition containing a photo-radical polymerizable poly(meth)acrylate such as polyurethane-based (meth)acrylate and polyisoprene-based (meth)acrylate and a photopolymerization initiator as main components. The term "(meth)acrylate" used herein includes acrylate and methacrylate.

Specifically, preferable examples of the photo-radical polymerizable poly(meth)acrylate may include a (meth) acrylate-based oligomer having polyisoprene, polybutadiene, or polyurethane as a skeleton.

Preferably, specific examples of a (meth)acrylate oligomer having a polyisoprene skeleton may include esterified compounds of maleic anhydride adduct of polyisoprene polymer and 2-hydroxyethyl methacrylate (UC102 (polystyrene equivalent molecular weight: 17,000), KURARAY CO., LTD.; UC203 (molecular weight in terms of polystyrene: 35,000), KURARAY CO., LTD.; and UC-1 (polystyrene equivalent molecular weight: 25,000), KURARAY CO., LTD.).

Preferably, specific examples of a (meth)acrylate-based oligomer having a polyurethane skeleton may include an aliphatic urethane acrylate (EBECRYL230 (molecular weight: 5,000), DAICEL-CYTEC Company, Ltd.; and UA-1, Light Chemical Industries Co., Ltd.).

Known photopolymerization initiators may be used as the photopolymerization initiator. Examples thereof may include 1-hydroxycyclohexyl phenyl ketone (IRGACURE 184, BASF), 2-hydroxy-1-{4-[4-(2-hydroxy-2-methyl-propionyl)benzyl]phenyl}-2-methyl-1-propan-1-one (IRGACURE 127, BASF), benzophenone, and acetophenone.

When the amount of such a photopolymerization initiator added is too small relative to 100 parts by mass of photo-radical polymerizable poly(meth)acrylate, curing is insufficient during irradiation with ultraviolet rays. When it is too large, outgas caused by cleavage is increased and a defect due to bubbling tends to occur. Therefore, it is preferably 0.1 to 5 parts by mass, and more preferably 0.2 to 3 parts by mass.

Further, the liquid photocurable resin composition 3 may contain a known plasticizer compatible with a photo-radical polymerizable poly(meth)acrylate (flexibility-imparting agent), for example, a terpene-based hydrogenated resin, polybutadiene, and polyisoprene. The plasticizer can be used as a tackifier, as described below.

Further, the photocurable resin composition 3 can contain a reactive diluent. Preferable examples of the reactive diluent may include 2-hydroxypropyl methacrylate, benzyl acrylate, and dicyclopentenyloxyethyl methacrylate.

Moreover, the photocurable resin composition 3 can contain general additives including an adhesion improving agent such as a silane coupling agent and an antioxidant, if necessary.

The photocurable resin composition 3 can further contain a chain-transfer agent for adjustment of molecular weight. Examples thereof may include 2-mercaptoethanol, lauryl mercaptan, glycidyl mercaptan, mercaptoacetic acid, 2-ethyihexyl thioglycolate, 2,3-dimethylcapto-1-propanol, and α-methylstyrene dimer.

In order to enhance the surface curing property of the photocurable resin composition 3 itself, an amine-based compound such as dimethylaminoethyl acrylate or a phosphorus-based compound such as acid phosphoxy methacrylate, which suppresses curing inhibition, can be added to the photocurable resin composition 3.

Further, the photocurable resin composition 3 can contain a so-called tackifier to impart stickiness to a cured material thereof. As the tackifier, terpene-based resins such as a terpene resin, a terpene-phenolic resin, and a hydrogenated terpene resin, rosin resins such as natural rosin, polymerized rosin, rosin esters, and hydrogenated rosins, petroleum resins such as polybutadiene and polyisoprene, or the like, can be used. The amount of the tackifier added is preferably 40 to 70 parts by mass relative to 100 parts by mass of photocurable resin composition.

A base material of the photocurable resin composition 3 is the photo-radical polymerizable poly(meth)acrylate described above. In order to exhibit an stickiness-imparting effect of the tackifier significantly, the base material can also contain a material in which a photo-radical polymerizable poly(meth)acrylate has been polymerized in advance. Examples of such a polymerized material may include a copolymer of butyl acrylate, and 2-hexyl acrylate and acrylic acid, and a copolymer of cyclohexyl acrylate and methacrylic acid.

<Step (B) (Curing Step)>

Next, the photocurable resin composition 3 applied in the step (A) is preferably irradiated with ultraviolet rays, as shown FIG. 1C described below, and cured to form a light-transmitting cured resin layer 6 (FIG. 1D). The reason for irradiation with ultraviolet rays, as shown in FIG. 1C, is to prevent the occurrence of curing inhibition by oxygen in air. For example, ultraviolet rays may be irradiated under reduced pressure or an inert gas atmosphere. Specifically, it is preferable that ultraviolet rays be irradiated in a state in which the light-transmitting cover member 2 to which the photocurable resin composition 3 is applied is placed in a closed chamber 4, and air in the chamber 4 is exhausted by a pump or replaced with an inert gas such as a nitrogen gas, to significantly decrease the oxygen concentration in the chamber 4. As a result, the cure rate of the outermost surface of the light-transmitting cured resin layer 6 can be increased. In order to transmit ultraviolet rays, it is preferable that a light-transmitting window 5 made of quartz glass, calcium fluoride, or the like be provided in the chamber 4. In this case, the cure rate of the outermost surface of the photocurable resin composition 3 is preferably 90% or more, and more preferably 95% or more, and the cure rate of the entire layer of the photocurable resin composition 3 is preferably 90% or more, and more preferably 95% or more. The cure rate (gel fraction) is a value defined as a ratio (ratio of consumption) of the present amount of (meth)acryloyl group after irradiation with ultraviolet rays to that of (meth) acryloyl group in the photocurable resin composition 3 before the irradiation with ultraviolet rays, and an increased value indicates progression of curing.

The cure rate (gel fraction) can be calculated by substituting an absorption peak height (X) at 1640 to 1620 $cm^{-1}$ from a base line in a chart of FT-IR measurement of the photocurable resin composition layer before the irradiation with ultraviolet rays and an absorption peak height (Y) at 1640 to 1620 $cm^{-1}$ from a base line in a chart of FT-IR measurement of the photocurable resin composition layer after the irradiation with ultraviolet rays into the following formula (1).

$$\text{Cure rate (\%)}=\{(X-Y)/X\}\times 100 \quad (1)$$

In the irradiation with ultraviolet rays, the kind, output, cumulative light amount of a light source are not particularly restricted as long as curing can be performed so that the cure rate (gel fraction) is 90% or more. A photo-radical polymerization process condition for (meth)acrylate by the known irradiation with ultraviolet rays can be adopted.

<Step (C) (Bonding Step)>

As shown in FIG. 1E, the light-transmitting cover member 2 is bonded to an image display member 7 from the light-transmitting cured resin layer 6 side. Bonding can be performed by pressurization at 10° C. to 80° C. using a known compression bonding device. Thus, an image display device 10 in which the image display member 7 and the light-transmitting cover member 2 are stacked through the light-transmitting cured resin layer 6 is obtained.

Examples of the image display member 7 may include liquid crystal display panels, organic EL display panels, plasma display panels, and touch panels. The touch panel used herein means an image display and input panel in which a display element such as a liquid crystal display panel and a position input device such as a touch pad are assembled.

The level of light transmission property of the light-transmitting cured resin layer 6 requires such a light transmission property that an image formed on the image display member 7 can be visually recognized, and the transmittance in the visible region (wavelength: 400 to 750 nm) is desirably 90% or more.

As described above, an example of applying a photocurable resin composition to a surface on a light-shielding layer side of a light-transmitting cover member has been described with reference to FIGS. 1A to 1E. Hereinafter, an example of applying a photocurable resin composition to a surface of an image display member will be described with reference to FIGS. 2A to 2D. In FIGS. 1A to 1E and 2A to 2D, the same reference numerals denote the same components.

<Step (AA) (Applying Step)>

As shown in FIG. 2A, a photocurable resin composition 3 is applied to a surface of an image display member 7. In this case, the application of the photocurable resin composition 3 may be performed a plurality of times until a necessary thickness is achieved.

<Step (BB) (Curing Step)>

Next, the photocurable resin composition 3 applied in the step (AA) is, for example, irradiated with ultraviolet rays, as shown FIG. 2B, and cured to form a light-transmitting cured resin layer 6 (FIG. 2C). The reason for irradiation with ultraviolet rays, as shown in FIG. 2B, is to prevent the occurrence of curing inhibition by oxygen in air. For example, ultraviolet rays may be irradiated under reduced pressure or an inert gas atmosphere. Specifically, it is preferable that ultraviolet rays be irradiated in a state in which the image display member 7 to which the photocurable resin composition 3 is applied is placed in a closed chamber 4, and air in the chamber 4 is exhausted by a pump or replaced with an inert gas such as a nitrogen gas, to significantly decrease the oxygen concentration in the chamber 4. Thus, the cure rate of the outermost surface of a light-transmitting cured resin layer 6 can be increased. In order to transmit ultraviolet rays, it is preferable that a light-transmitting window 5 made of quartz glass, calcium fluoride, or the like be provided in the chamber 4. In this case, it is desirable that the cure rate of the outermost surface of the photocurable resin composition 3 be 90% or more, and preferably 95% or more, and the cure rate of the entire layer of the photocurable resin composition 3 be 90% or more, and preferably 95% or more.

While not shown in the drawings, a release film may be stacked on the photocurable resin composition 3, irradiated with ultraviolet rays, and released before the next step.

<Step (CC) (Bonding Step)>

As shown in FIG. 2D, the light-transmitting cover member 2 is bonded to the light-transmitting cured resin layer 6 of the image display member 7 from the light-shielding layer 1 side. Bonding can be performed by pressurization at 10 to 80° C. using a known compression bonding device. Thus, an image display device 10 (FIG. 2D) in which the image display member 7 and the light-transmitting cover member 2 are stacked through the light-transmitting cured resin layer 6 is obtained.

Examples of the image display member 7 may include liquid crystal display panels, organic EL display panels, plasma display panels, and touch panels.

The level of light transmission property of the light-transmitting cured resin layer 6 requires such a light transmission property that an image formed in the image display member 7 can be visually recognized.

EXAMPLES

Hereinafter, the present invention will be described more specifically by Examples.

Example 1

6 Parts by weight of polyisoprene methacrylate (UC102, KURARAY CO., LTD.) as a photocurable resin composition, 15 parts by weight of dicyclopentenyloxyethyl methacrylate and 5 parts by weight of lauryl methacrylate as reactive diluents, 20 parts by weight of polybutadiene (Polyvest110, Evonik Degussa GmbH) as a plasticizer, 1 part by weight of photopolymerization initiator (IRGACURE 184, BASF), and 53 parts by weight of hydrogenated terpene resin (Clearon M105, YASUHARA CHEMICAL CO., LTD.) as a tackifier were uniformly mixed and prepared. The viscosity of the photocurable resin composition (cone-plate rheometer, 25° C., cone and plate: C35/2, rotation speed: 10 rpm) was about 6 Pa·s.

(Step (A) (Applying Step))

The photocurable resin composition was then discharged onto a glass plate having a light-shielding layer with a size of 40 (w)×70 (l)×0.4 (t) mm by a resin dispenser, to form a photocurable resin composition film with an average thickness of 200 μm.

(Step (B) (Curing Step))

The glass plate having a light-shielding layer in which the photocurable resin composition film was formed was placed in a chamber capable of vacuuming and the pressure inside the chamber was reduced by a vacuum pump. At this time, the degree of reduced pressure was 10 Pa. While the degree of reduced pressure was maintained, the photocurable resin composition film was irradiated with ultraviolet rays having a strength of 50 mW/cm$^2$ for 40 seconds by an UV irradiation apparatus (LC-8, Hamamatsu Photonics K.K.) so that the integrated light intensity was 2,000 mJ/cm$^2$. Thus, the photocurable resin composition film was cured to form a light-transmitting cured resin layer. After then, the pressure inside the chamber was returned to atmospheric pressure.

The cure rate was determined using the absorption peak height at 1640 to 1620 cm$^{-1}$ from a base line in a chart of FT-IR measurement of the photocurable resin composition layer obtained by curing as an index, and was found to be 99%. In order to determine the cure rate of the outermost surface, the photocurable resin composition was applied to a glass substrate so that the thickness was 5 μm, and cured similarly. This cured material was used. The cure rate was similarly determined and was found to be 99%.

(Step (C) (Bonding Step))

Then, the glass plate having a light-shielding layer obtained in the step (B) was placed on a face on which a polarizing plate of a liquid crystal display element with a size of 35 (W)×65 (L) mm was stacked so that the light-transmitting cured resin layer side was the polarizing plate side. The glass plate was bonded by pressurization from the glass plate side with a rubber roller. Thus, a liquid crystal display device was manufactured. When the liquid crystal display element was observed visually from the glass plate side, air bubbles were not confirmed between the polarizing plate and the light-transmitting cured resin layer.

<Evaluation>

The liquid crystal display device obtained in Example 1 was subjected to a creep test under a heating environment, and the presence or absence of defect such as peeling and gap was observed visually as described below. Further, the strength of the light-transmitting cured resin layer under a heating environment was tested and evaluated as described below.

(Evaluation of Creep Under Heating Environment)

As shown in FIG. 3, the liquid crystal display device 30 manufactured in Example 1, in which the glass plate 31 having a light-shielding layer and the liquid crystal display element 32 were stacked through the light-transmitting cured resin layer 6, was fixed so that the liquid crystal display element 32 side was vertical. The liquid crystal display device was allowed to stand for 72 hours under an environment of 85° C. while held in the state, After then, the liquid crystal display device was taken out under an environment of normal temperature, and evaluated by visual observation in accordance with the following criteria. The evaluation was "A."

Rank Criteria

A: a case where peeling due to air bubbles does not occur and a gap in a glass plate having a light-shielding layer is not generated.

B: a case where peeling due to air bubbles occurs, but a gap in a glass plate is not generated.

C: a case where peeling due to air bubbles occurs, and a gap in a glass plate is also generated.

(Evaluation of Adhesion State Under Heating Environment)

When a liquid crystal display device is produced, a glass base 41 with a size of 40 (W)×70 (L) mm was used instead of a liquid crystal display element as shown in FIG. 4. Then, a glass plate 42 having a light-transmitting cured resin layer was bonded to the glass base 41 from the light-transmitting cured resin layer side in a cross shape to obtain a glass bonded body 40. The glass base 41 disposed at the lower side was fixed and the glass plate 42 disposed at the upper side was peeled immediately upward under an atmosphere of 85° C. The peeling state was observed visually, and the adhesion state was evaluated in accordance with the following criteria. The evaluation was "A."

Rank Criteria

A: a case where cohesive peeling occurs.

B: a case where interfacial peeling occurs.

C: a case where interfacial peeling occurs and residue of uncured component remains.

Example 2

A liquid crystal display device and a glass bonded body for measurement of adhesion strength were manufactured in the same manner as in Example 1 except that the degree of reduced pressure inside the chamber was changed to 100 Pa in the step (B) (curing step) of Example 1. The presence or absence of air bubbles was observed and the adhesion state was evaluated. As a result, the cure rate of the outermost surface of the light-transmitting cured resin layer was 92% and the cure rate of the entire light-transmitting cured resin layer was 93%. The evaluation of creep under a heating environment was "A," and the evaluation of adhesion state under a heating environment was also "A."

Example 3

A liquid crystal display device and a glass bonded body for measurement of adhesion strength were manufactured in the same manner as in Example 1 except that the pressure inside the chamber was not reduced and the air inside the chamber was replaced with nitrogen in the step (B) (curing step) of Example 1. The presence or absence of air bubbles was observed and the adhesion state was evaluated. As a result, the cure rate of the outermost surface of the light-transmitting cured resin layer was 95% and the cure rate of the entire light-transmitting cured resin layer was 96%. The evaluation of creep under a heating environment was "A," and the evaluation of adhesion state under a heating environment was also "A."

Comparative Example 1

A liquid crystal display device and a glass bonded body for measurement of adhesion strength were manufactured in the same manner as in Example 1 except that the photocurable resin in Example 1 was used, the air inside the chamber was not purged, and the atmospheric pressure was used as it was in the step (B) (curing step) of Example 1. At this time, the cure rate of the outermost surface of the light-transmitting cured resin layer was 75% and the cure rate of the entire layer was 90%. The adhesion state of the liquid crystal display device and the glass bonded body was evaluated. As a result, the evaluation of creep under a heating environment was "C," and the evaluation of adhesion state under a heating environment was also "C."

Comparative Example 2

A liquid crystal display device and a glass bonded body for measurement of adhesion strength were manufactured in the same manner as in Example 1 except that the photocurable resin composition of Example 1 was used and the degree of reduced pressure inside the chamber was changed to 1,000 Pa in the step (B) (curing step) of Example 1. At this time, the cure rate of the outermost surface of the light-transmitting cured resin layer was 82% and the cure rate of the entire layer was 90%. The adhesion state of the liquid crystal display device and the glass bonded body was evaluated. As a result, the evaluation of creep under a heating environment was "C," and the evaluation of adhesion state under a heating environment was also "C."

INDUSTRIAL APPLICABILITY

According to the method for manufacturing an image display device of the present invention, a light-transmitting cured resin layer between a light-shielding layer and an image display member can be sufficiently cured by light, and a stacked body in which peeling due to insufficient adhesion and peeling and a gap under a heating environment do not occur can be produced. The manufacturing method of the present invention is useful in industrial manufacturing of a data terminal such as a smartphone equipped with a touch panel and a touch pad.

REFERENCE SIGNS LIST

1 Light-shielding layer
2 Light-transmitting cover member
3 Photocurable resin composition
4 Chamber
5 Light-transmitting window
6 Light-transmitting cured resin layer
7 Image display member
10 Image display device
30 Liquid crystal display device
31 Glass plate
32 Liquid crystal display element
40 Glass bonded body
41 Glass base
42 Glass plate

The invention claimed is:

1. A method for manufacturing an image display device, wherein an image display member and a light-transmitting cover member having a light-shielding layer formed in a peripheral portion of one of its major surfaces are stacked through a light-transmitting cured resin layer formed from a liquid composition consisting essentially of a liquid photo-radical polymerizable resin so that the light-shielding layer-forming surface of the light-transmitting cover member is disposed on the image display member side, the method comprising the following subsequent steps:
  a step of applying the liquid photo-radical polymerizable resin to the light-shielding layer-forming surface of the light-transmitting cover member or the display surface of the image display member to form a liquid photo-radical polymerizable resin layer, the liquid photo-radical polymerizable resin layer consisting essentially of the liquid photo-radical polymerizable resin;
  a step of irradiating the liquid photo-radical polymerizable resin layer with ultraviolet rays under reduced pressure or an inert gas atmosphere so that the cure rate of the entire layer is 90% or more, and the liquid photo-radical polymerizable composition resin is not in contact with oxygen, to form the light-transmitting cured resin layer; and
  a step of bonding the light-transmitting cover member to the image display member so that the light-transmitting cured resin layer is placed between the light-transmitting cover member and the image display member.

2. The manufacturing method according to claim 1, wherein the image display member is a liquid crystal display panel, an organic EL display panel or a touch panel.

3. The manufacturing method according to claim 2, wherein the liquid photo-radical polymerizable resin contains a polyurethane-based (meth)acrylate or a polyisoprene-based (meth)acrylate, and a flexibility-imparting agent.

4. The manufacturing method according to claim 1, wherein the liquid photo-radical polymerizable resin contains a polyurethane-based (meth)acrylate or a polyisoprene-based (meth)acrylate, and a flexibility-imparting agent.

5. A method for manufacturing an image display device, wherein an image display member and a light-transmitting cover member having a light-shielding layer formed in a peripheral portion of one of its major surfaces are stacked through a light-transmitting cured resin layer formed from a liquid composition consisting essentially of:
  a liquid photo-radical polymerizable resin, and
  a plasticizer,
so that the light-shielding layer-forming surface of the light-transmitting cover member is disposed on the image display member side, the method comprising the following subsequent steps:
  a step of applying the liquid photo-radical polymerizable resin and the plasticizer to the light-shielding layer-forming surface of the light-transmitting cover member or the display surface of the image display member to form a liquid photo-radical polymerizable resin layer, the liquid photo-radical polymerizable resin layer consisting essentially of the liquid photo-radical polymerizable resin and the plasticizer;
  a step of irradiating the liquid photo-radical polymerizable resin layer with ultraviolet rays under reduced pressure or an inert gas atmosphere so that the cure rate of the entire layer is 90% or more, and the liquid photo-radical polymerizable resin is not in contact with oxygen, to form the light-transmitting cured resin layer; and
  a step of bonding the light-transmitting cover member to the image display member so that the light-transmitting cured resin layer is placed between the light-transmitting cover member and the image display member.

* * * * *